(12) United States Patent
Morizuka et al.

(10) Patent No.: US 8,969,917 B2
(45) Date of Patent: Mar. 3, 2015

(54) SEMICONDUCTOR DEVICE AND METHOD FOR MANUFACTURING SAME

(71) Applicant: Kabushiki Kaisha Toshiba, Tokyo (JP)

(72) Inventors: Mayumi Morizuka, Kanagawa-ken (JP); Yoshiharu Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/788,658

(22) Filed: Mar. 7, 2013

(65) Prior Publication Data

US 2013/0256753 A1 Oct. 3, 2013

(30) Foreign Application Priority Data

Mar. 28, 2012 (JP) ................................. 2012-074274

(51) Int. Cl.
*H01L 29/66* (2006.01)
*H01L 29/772* (2006.01)
(Continued)

(52) U.S. Cl.
CPC ........ *H01L 29/772* (2013.01); *H01L 29/66431* (2013.01); *H01L 29/36* (2013.01);
(Continued)

(58) Field of Classification Search
CPC ... H01L 29/2003; H01L 29/36; H01L 29/402; H01L 29/66431; H01L 29/66462; H01L 29/772; H01L 29/7787; H01L 29/812
USPC ........ 257/192, 194, 76, 77; 438/191, 12, 285, 438/253
See application file for complete search history.

(56) References Cited

U.S. PATENT DOCUMENTS

2007/0224710 A1 9/2007 Palacios et al.
2008/0290371 A1* 11/2008 Sheppard et al. ............. 257/192
(Continued)

FOREIGN PATENT DOCUMENTS

JP 3380139 12/2002
JP 2008-172055 7/2008
(Continued)

OTHER PUBLICATIONS

Jungwoo Joh, et al., "A model for the critical voltage for electrical degradation of GaN high electron mobility transistors", Microelectronics Reliability, vol. 50, 2010, pp. 767-773.
(Continued)

*Primary Examiner* — Mohammed Shamsuzzaman
(74) *Attorney, Agent, or Firm* — Oblon, Spivak, McClelland, Maier & Neustadt, L.L.P.

(57) ABSTRACT

According to an embodiment, a semiconductor device includes a first layer including a first nitride semiconductor, a second layer provided on the first layer and including a second nitride semiconductor having a wider bandgap than the first nitride semiconductor. The device also includes a source electrode and a drain electrode provided on the second layer; and a gate electrode provided on the second layer and located between the source electrode and the drain electrode. The second layer includes a first region between the gate electrode and the drain electrode, the first region being selectively provided in a surface of the second layer and contains fluorine. A concentration of fluorine in the first region is higher than a concentration of fluorine in a portion underneath the gate electrode in the second layer.

5 Claims, 10 Drawing Sheets

(51) Int. Cl.
  *H01L 29/36* (2006.01)
  *H01L 29/778* (2006.01)
  *H01L 29/812* (2006.01)
  *H01L 29/40* (2006.01)
  *H01L 29/20* (2006.01)

(52) U.S. Cl.
  CPC ........ *H01L 29/402* (2013.01); *H01L 29/66462* (2013.01); *H01L 29/7787* (2013.01); *H01L 29/812* (2013.01); *H01L 29/2003* (2013.01)
  USPC .............. 257/192; 257/194; 257/76; 257/77; 438/191; 438/12; 438/285; 438/253

(56) References Cited

U.S. PATENT DOCUMENTS

2009/0039392 A1* 2/2009 Herman .................. 257/192
2009/0200576 A1* 8/2009 Saito et al. .................. 257/194
2009/0230331 A1* 9/2009 Koudymov et al. ........ 250/493.1
2012/0061729 A1* 3/2012 Shibata et al. ................ 257/194

FOREIGN PATENT DOCUMENTS

| JP | 2009-507396 | 2/2009 |
| JP | 2010-186943 | 8/2010 |
| WO | WO 2008/027027 | 3/2008 |

OTHER PUBLICATIONS

Japanese Office Action issued on May 15, 2014 in counterpart Japanese patent application No. 2012-074274, with English translation, 6 pages, citing documents AA, AO, AP and AQ therein.
Office Action issued Oct. 17, 2014 in Japanese Patent Application No. 2012-074274 (with English translation).

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2012-074274, filed on Mar. 28, 2012; the entire contents of which are incorporated herein by reference.

FIELD

Embodiments are related generally to a semiconductor device and a method for manufacturing the same.

BACKGROUND

A semiconductor device, such as a transistor and a diode, using a nitride semiconductor operates at a high voltage and exhibits a high electric current density compared with a conventional semiconductor device. Therefore, the output power density and the operation frequency of the device can be raised, which allows such a device to be used in power control or to be used as a high frequency power amplifier.

However, this device suffers from a failure mode in which a drain current decreases due to the crack formed in an AlGaN layer. The crack is considered to be generated at the gate edge of the FET (Field Effect Transistor) due to the piezo-electric phenomenon. That is, when a voltage is applied between a gate and a drain, the strength of the electric field becomes large at the gate edge on the drain side. Then, the large electric field at the gate edge increases the stress due to the piezoelectric phenomenon, resulting in the crack.

DETAILED DESCRIPTION

Figure 1:
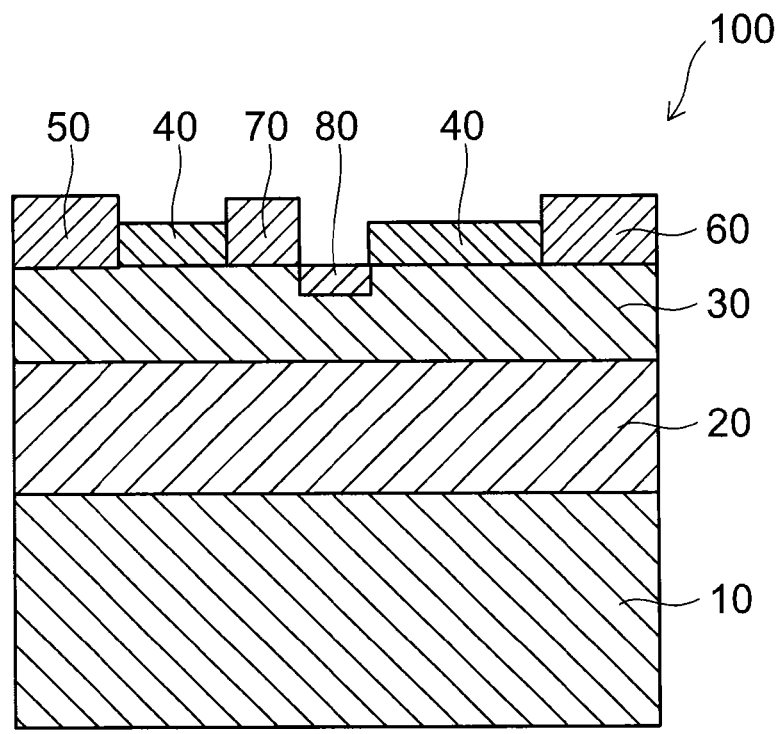
FIG. 1 is a schematic cross-sectional view of a nitride semiconductor device according to a first embodiment.

According to an embodiment, a semiconductor device includes a first layer including a first nitride semiconductor; a second layer provided on the first layer and including a second nitride semiconductor having a wider bandgap than the first nitride semiconductor. The device also includes a source electrode and a drain electrode provided on the second layer; and a gate electrode provided on the second layer and located between the source electrode and the drain electrode. The second layer includes a first region between the gate electrode and the drain electrode, the first region being selectively provided in a surface of the second layer and contains fluorine. A concentration of fluorine in the first region is higher than a concentration of fluorine in a portion underneath the gate electrode in the second layer.

Hereafter, embodiments are described referring to the drawings. Throughout the drawings, like components are denoted by like reference letters and a detailed description thereof is appropriately omitted.

FIG. 1 is a schematic cross-sectional view of a nitride semiconductor device according to a first embodiment.

A nitride semiconductor device 100 according to the first embodiment is a field effect transistor, and it includes a base layer 10, a first layer 20 provided on the base layer 10, and a second layer 30 provided on the first layer 20.

A passivation layer 40, a source electrode 50, and a drain electrode 60 are provided on the second layer 30. In addition, a gate electrode 70 is provided on the second layer 30 and is located between the source electrode 50 and the drain electrode 60. The source electrode 50 and the drain electrode 60 form an ohmic contact with the second layer 30. The gate electrode 70 forms a Schottky contact with the second layer 30. The source electrode 50, the drain electrode 60, and the gate electrode 70 may be formed, for example, in a stripe shape when viewed from above the major face of the second layer 30.

Moreover, as for the gate electrode 70, a so-called MIS (Metal-Insulator-Semiconductor) structure, in which a gate insulating film (not illustrated) is provided between the second layer 30 and the gate electrode 70, may be adopted instead of using a structure in which a Schottky contact is formed.

The base layer 10 may be a substrate of, for example, sapphire, SiC, silicon, and gallium nitride, and the like, or a buffer layer formed on the substrate. Alternatively, the base layer 10 may be a one prepared by growing the first layer 20 and the second layer 30 on a substrate of sapphire or the like with a buffer layer interposed between them, removing at least part of the substrate and the buffer layer, and pasting a new supporting substrate on the resultant structure. In any case, the base layer 10 is not an essential component in the embodiment.

The first layer 20 is formed of a first nitride semiconductor and serves, for example, as a career transport layer.

The second layer 30 is formed of a second nitride semiconductor having a wider bandgap than the first nitride semiconductor and serves, for example, as a barrier layer.

The "nitride semiconductor" referred to herein includes group III-V compound semiconductors of $In_xAl_yGa_{1-x-y}N$ ($0 \le x \le 1$, $0 \le y \le 1$, $0 \le x+y \le 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

For example, GaN may be used as the first nitride semiconductor which forms the first layer 20. Alternatively, InGaN, AlGaN, and InAlGaN may be used for the first nitride semiconductor.

Any of the following materials may be used as the second nitride semiconductor to form the second layer 30, such as non-doped or n-type $Al_XGa_{1-X}N$ (0<X≤1) having a bandgap wider than that of the first nitride semiconductor; $In_YAl_{1-Y}N$ (0<Y≤1); mixed compounds of the non-doped or n-type $Al_XGa_{1-X}N$ (0<X≤1) and $In_YAl_{1-Y}N$ (0<Y≤1); and a stacked body of the non-doped or n-type $Al_XGa_{1-X}N$ (0<X≤1) and $In_YAl_{1-Y}N$ (0<Y≤1).

The film thickness of the second layer 30 may be about 5 nm to 50 nm, for example.

In such a stacked body, a two-dimensional electron gas is generated within the first layer 20, especially in the vicinity of the interface of the first layer 20 and second layer 30.

With adjustment of a voltage applied to the gate electrode 70, the second layer 30 is caused to enter a depletion state, thereby intercepting the two-dimensional electron gas. Then, switching operation can be achieved between the source electrode 50 and the drain electrode 60.

Moreover, the second layer 30 includes a first region 80 containing fluorine, which is selectively formed in the surface. The first region 80 is located between the gate electrode 70 and the drain electrode 60 so as to be adjacent to the gate electrode 70. The first region 80 and the gate electrode 70 may be adjacent to each other as illustrated in FIG. 1. Alternatively, a portion of the first region 80 may be provided under the gate electrode 70, or the first region 80 and the gate electrode 70 may be separated from each other.

The concentration of the fluorine contained in the first region 80 is higher than the concentration of fluorine in a portion of the second layer 30 which is provided underneath the gate electrode 70. Typically, the portion of the second layer 30 provided underneath the gate electrode 70 contains substantially no fluorine.

Providing the first region 80 may alleviate the electric field at the edge of gate electrode 70. That is, when a semiconductor device 100 operates as a switching device, an electric voltage (drain voltage) is applied between the drain electrode 60 and the gate electrode 70. The electric field attributable to the drain voltage tends to concentrate on the edge of the gate electrode 70, which locates on a side of the drain electrode 60. When the electric field concentrates within the second layer 30, the stress is generated by the piezoelectric effect within the second layer 30. The effect is especially remarkable when the crystal growth face of the first layer 20 and the second layer 30 is (0001) face. As the strength of the electric field increases, the stress also correspondingly increases and the crystal defect is introduced into the second layer 30, which finally leads to the damage such as the crack. Such a crystal defect and the crack impair the reliability of the semiconductor device. Here, the crystal growth face of the first layer 20 is, for example, the interface between the first layer 20 and the second layer 30, and the crystal growth face of the second layer 30 is the upper surface which is parallel to the interface.

On the other hand, the first region 80 containing fluorine is provided according to the embodiment. Fluorine generates negative fixed charges within a nitride semiconductor. The negative fixed charges alleviate the electric field attributable to the drain voltage, and reduce the stress applied to the second layer 30. As a result, the generation of the crystal defect, the crack, and the like that are attributable to the application of the drain voltage can be suppressed, and as a result, the semiconductor device 100 can be provided with high reliability.

Hereafter, the advantageous effect of the embodiment is described in more detail referring to specific examples.

Figure 2:
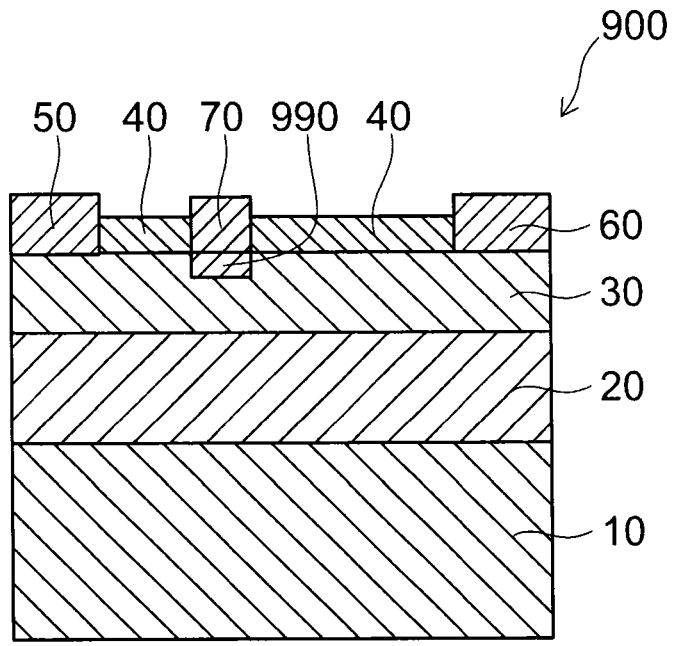
FIG. 2 is a schematic cross-sectional view of a semiconductor device according to a reference example.

FIG. 2 is a schematic cross-sectional view of a semiconductor device according to a reference example.

In a semiconductor device 900 of the reference example, a region 990 containing fluorine is provided in a second layer 30, especially in a portion underneath a gate electrode 70.

Figure 3:
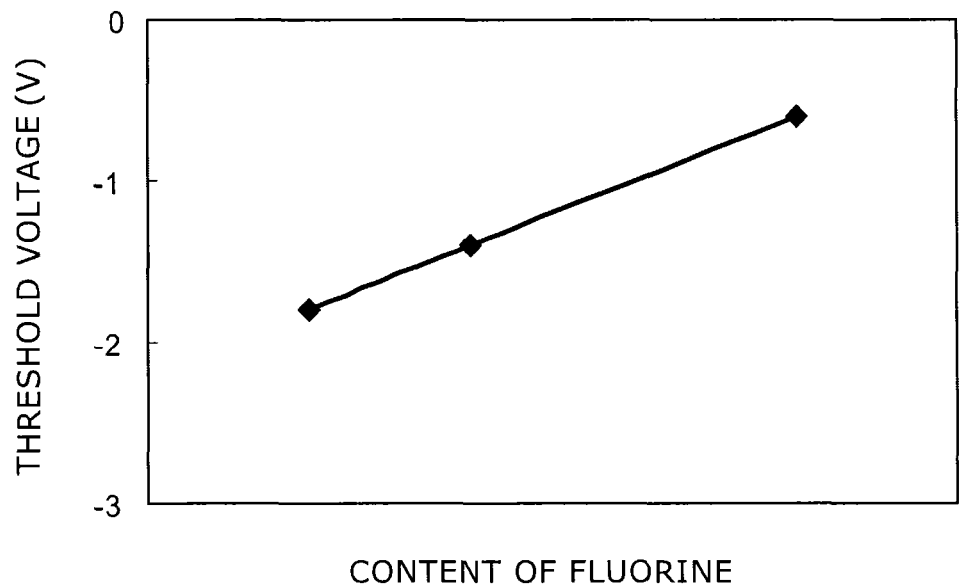
FIG. 3 is a graph illustrating an effect of fluorine introduced into a region of the semiconductor device according to the reference example.

FIG. 3 is a graph illustrating the effect of fluorine introduced into the region 990 of the semiconductor device 900 according to the reference example.

That is, in FIG. 3, the longitudinal axis indicates the gate threshold value, and the abscissas axis indicates the content of fluorine in the region 990.

Here, the second layer 30 was formed of AlGaN. ICP-RIE (Inductively Coupled Plasma-Reactive Ion Etching) using a gas containing $SF_6$ may be adopted for introducing fluorine. The dose of fluorine introduced into the second layer 30 is adjusted by processing time of ICP-RIE. When this method is used, the second layer 30 is nearly unetched by the ICP-RIE.

The effect of fluorine introduced into AlGaN can be confirmed by evaluating the threshold voltage of the drain current of a semiconductor field effect transistor. As understood from FIG. 3, the threshold voltage increases as the content of fluorine in the second layer 30 increases. Furthermore, it also can be found that both of the negative electric charge and the surface potential increase as the dose of fluorine increases.

The depth of the region 990 into which fluorine is introduced can be determined by sequentially etching the surface of the second layer 30 (AlGaN layer) and examining the change in contact resistance of the ohmic electrode formed on the region into which fluorine is introduced.

Figure 4:
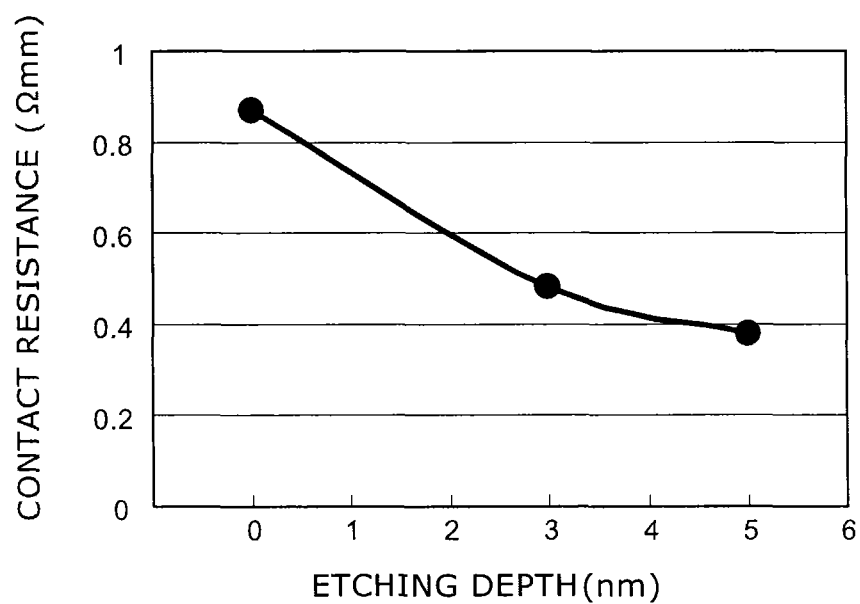
FIG. 4 is a graph illustrating a relationship between a processing time for etching the second layer and a contact resistance of the ohmic electrode.

FIG. 4 is a graph that illustrates a relationship between a processing time for etching the second layer 30 and a contact resistance of the ohmic electrode.

That is, fluorine was introduced into the second layer (AlGaN layer) 30 with the ICP-RIE using a gas containing $SF_6$, then the surface of the second layer 30 (AlGaN layer) was etched with a chlorine-based gas, and finally the variation in the contact resistance was evaluated according to the etching depth.

As understood from FIG. 4, when the surface of the second layer 30 containing fluorine is removed, the contact resistance is reduced and the reduction in resistance stops almost at a depth of 5 nm. From this result, it can be estimated that the depth of the region 990 containing fluorine, which exhibits the effect of raising the surface potential, is about 5 nm.

From these results, it is found to be able to raise the surface potential by introducing fluorine into the surface of the second layer 30.

The inventor(s) confirmed the alleviation effect of electric field concentration on the drain-side edge of the gate electrode 70, with a two-dimensional device simulation in the semiconductor device 100 illustrated in FIG. 1.

The device model was assumed that fluorine was contained as acceptors in a region ranging from the surface to a depth position of 5 nm in the structure illustrated in FIG. 1 so that the surface potential of a first region 80 may be 1 eV higher than that of the case without fluorine.

The threshold voltage of the drain current is −2.5 V, and the drain current is turned off, when the gate voltage is −4 V. In this device, the field strength distribution at the maximum drain voltage of 100 V was calculated, assuming a large signal operation with the drain voltage of 40V. As a result, in the semiconductor device 100 illustrated in FIG. 1, the maximum field strength at the gate-side edge of the gate electrode 70 has decreased by about 11% in the vertical direction compared with the semiconductor device 900 in the reference example illustrated in FIG. 2. When the drain voltage is increased further, the decreasing effect of the longitudinal electric field strength is more remarkable, which is achieved by providing the region 80.

From this result, as for the semiconductor device 100 illustrated in FIG. 1, it is found that the stress decreases under applying the drain voltage, and the crystal defect and the crack generation are prevented in the second layer 30. Thereby, it becomes possible to achieve longer life and higher reliability.

Next, a method of manufacturing the semiconductor device 100 illustrated in FIG. 1 is described.

FIGS. 5A to 6C are cross-sectional views illustrating a manufacturing method of the semiconductor device 100.

Figure 5A:
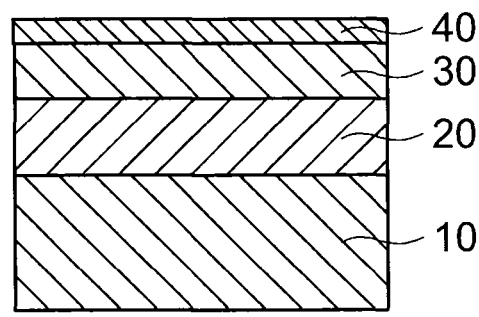
FIGS. 5A to 6C are cross-sectional views illustrating a manufacturing method of the semiconductor device.

First of all, the first layer 20 and the second layer 30 are grown on a base layer 10, for example, using an MOCVD (Metal-Organic Chemical Vapor Deposition) method as illustrated in FIG. 5A. The first layer is formed of GaN with a thickness of 1 to 3 μm, and the second layer 30 is formed of AlGaN with a thickness of 5 to 50 nm. The base layer 10 may be a buffer layer, such as an AlN layer or a GaN/AlGaN superlattice layer, suitably formed on a substrate of SiC or the like.

In addition, an SiN film serving as the passivation layer 40 is formed with a thickness of 20 to 200 nm on the second layer 30, for example, using a PE-CVD (Plasma-Enhanced Chemical Vapor Deposition) method.

Figure 5B:
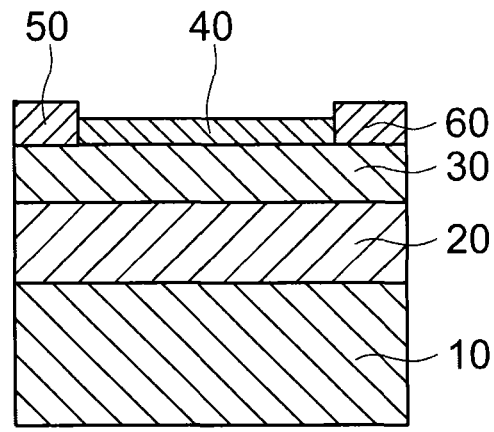

Next, a source electrode 50 and a drain electrode 60 are formed as illustrated in FIG. 5B. That is, openings are formed in the passivation layer 40 using the photolithography, and a multilayer film including aluminum (Al) is formed for example, which is formed into the source electrode 50 and the drain electrode 60.

Figure 5C:
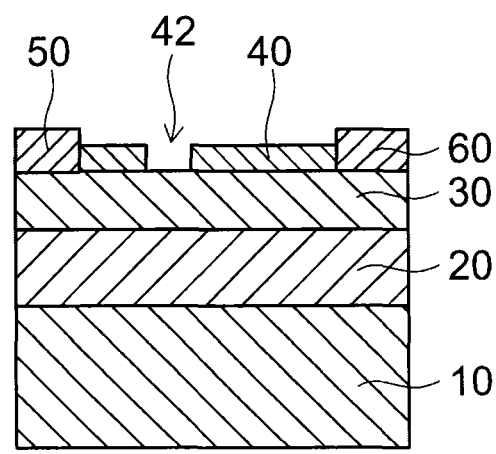

Next, as illustrated in FIG. 5C, an opening 42 for a gate electrode is formed between the source electrode 50 and the drain electrode 60.

Figure 6A:
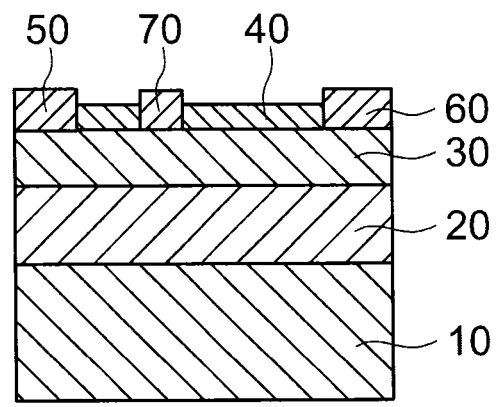

Next, as illustrated in FIG. 6A, a gate electrode 70 is formed in the opening 42. For example, a multilayer film including nickel (Ni) or platinum (Pt) is formed as the gate electrode 70.

Figure 6B:
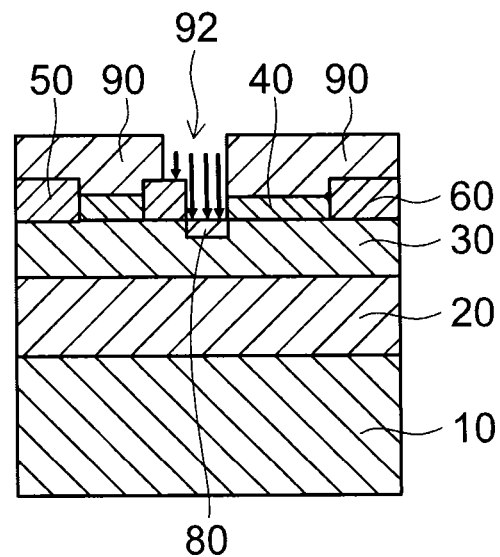

Next, a mask 90 such as photoresist mask is formed using photolithography as illustrated in FIG. 6B, in which an opening is formed at an area where a drain-side edge of the gate electrode 70 exists. ICP-RIE using a gas containing $SF_6$ is performed on this opening 92. The passivation layer 40 is removed by ICP-RIE. In addition, ICP-RIE is continuously performed after removing the passivation layer 40 in order to form the first region 80 containing fluorine.

Figure 6C:
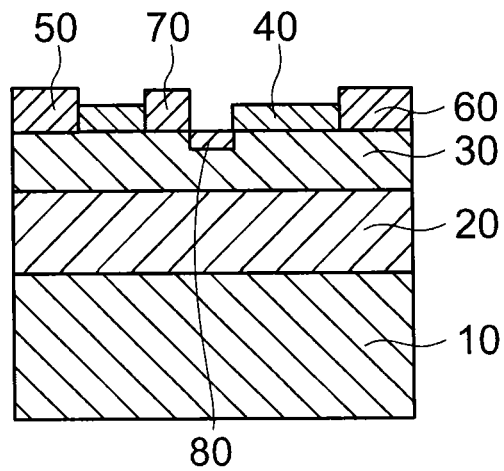

Subsequently, the mask 90 is removed as illustrated in FIG. 6C, and then a gate shaping process for reducing gate resistance, an interconnection process, a passivation process, and the like are further performed as necessary. Moreover, a device isolation process is performed at an appropriate stage depending on the selected processes.

The semiconductor device 100 illustrated in FIG. 1 can be manufactured through the method described above.

The described method is advantageous in that the removal of the passivation layer 40 and the introduction of fluorine are executed with the same process as illustrated in FIG. 6B.

Furthermore, it is also advantageous in that the first region 80 can be formed adjacent to the gate electrode 70 in a self-aligned manner, since fluorine can be introduced into the surface of the second layer 30 using the gate electrode 70 as a mask, Besides the gas containing $SF_6$, a gas containing $CF_4$ or a gas containing other types of fluorine also may be used for introducing fluorine.

Moreover, the condition for etching the passivation layer 40 and the condition for introducing fluorine into the second layer 30, which is performed after the etching of the protective layer 40, may be changed in the process illustrated FIG. 6B. Specifically, for example, flow rate and pressure of the gas containing fluorine, or power and application voltage for generating plasma may be changed. On the other hand, the gas containing fluorine may not be used in this process of removing the passivation layer 40, but fluorine may be introduced into the second layer 30 by using the gas containing fluorine after removing the protective layer 40.

Each process illustrated in FIGS. 5A 6C may be changed in execution order within a range technically available. Such cases also fall within the scope of the embodiment.

Figure 7:
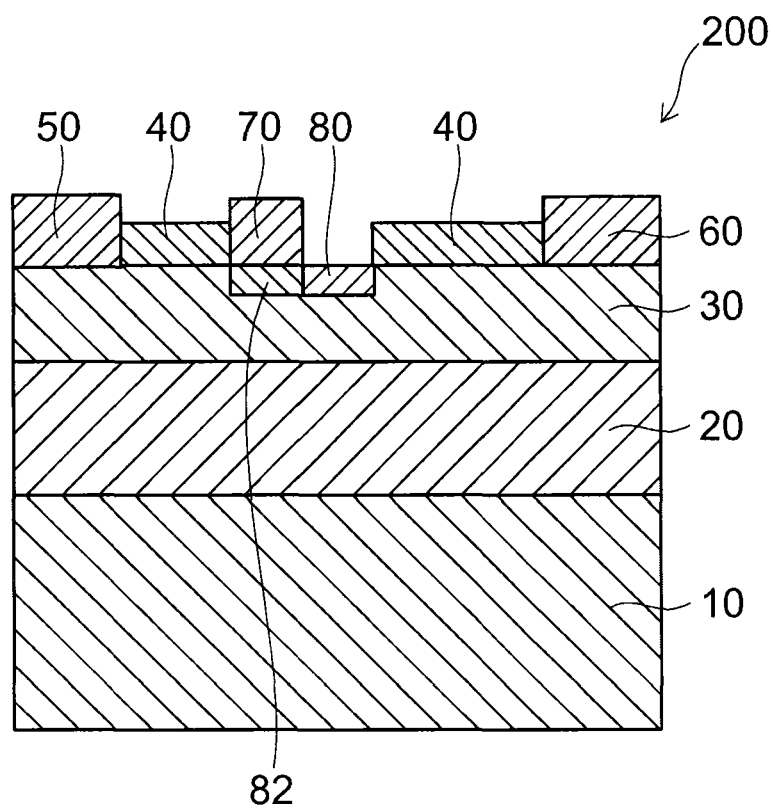
FIG. 7 is a schematic cross-sectional view of a nitride semiconductor device according to a second embodiment.
Figure 8A:
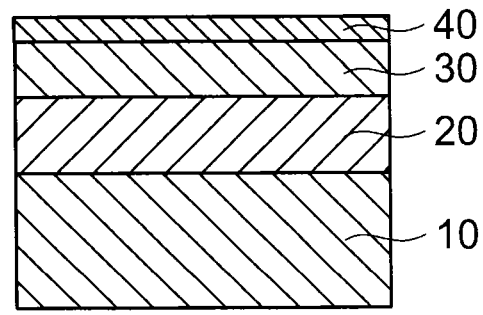
FIGS. 8A to 9C are cross-sectional views illustrating a manufacturing method of the semiconductor device according to the second embodiment.
Figure 8B:
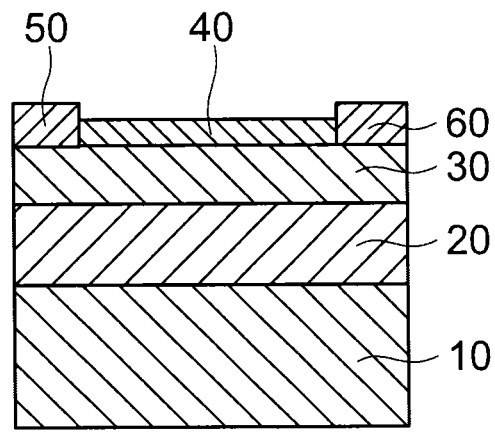
Figure 8C:
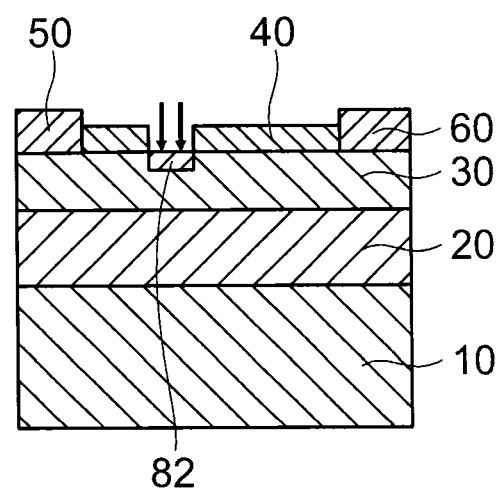

FIG. 7 is a schematic cross-sectional view of a nitride semiconductor device according to a second embodiment. In the second embodiment and the subsequent embodiments, like components described above are denoted by like reference numbers through the drawings, and a description thereof is appropriately omitted.

In a semiconductor device 200 according to the embodiment, a second region 82 containing fluorine is provided in a portion underneath a gate electrode 70. The concentration of the fluorine contained in the second region 82 is lower than the concentration of fluorine contained in the first region 80.

Owing to the second region 82, the concentration of electrons under the gate decreases and thus gate leak current can be reduced. FIGS. 8A to 9C are cross-sectional views that illustrate a manufacturing method of the semiconductor device 200. In the embodiment, fluorine is introduced into a second layer 30 so as to form the second region 82 through the process illustrated in FIG. 8C after removing a passivation layer 40. At this time, ICP-RIE using a gas containing $SF_6$ may be carried out for example. That is, the second region 82 may be formed by etching the protective layer 40 with ICP-RIE that uses a gas including $SF_6$, and continuously further carrying out the RIE. Various methods described above referring to FIGS. 1 to 7 may be similarly adopted as a method for introducing fluorine.

Figure 9A:
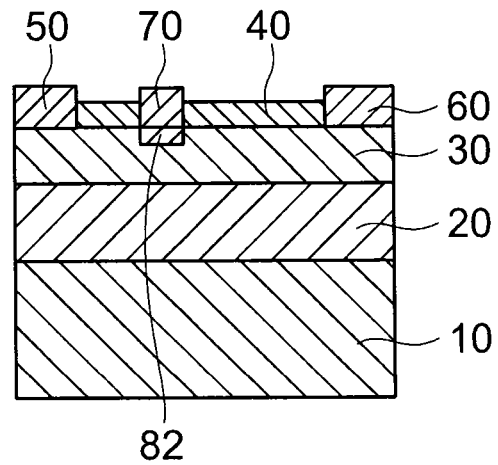
Figure 9B:
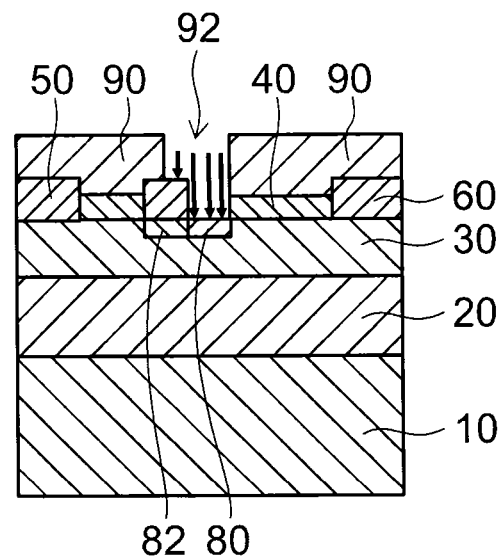
Figure 9C:
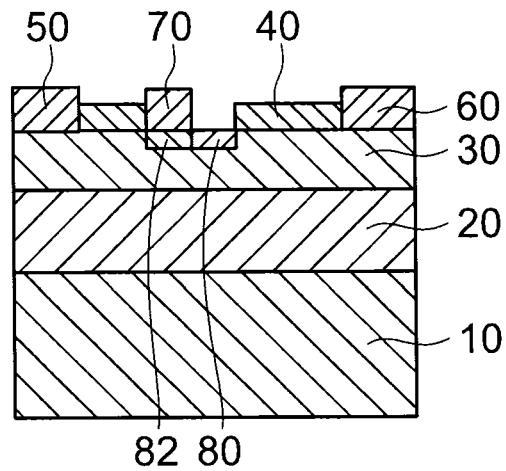

The subsequent processes may correspond to FIGS. 9A to 9C and may be similar to ones which have been described above referring to FIGS. 6A to 6C.

However, as for the process illustrated in FIG. 9B, the process is performed such that the concentration of fluorine in the first region 80 becomes higher than the concentration of fluorine in the second region 82. For example, in both of the processes illustrated in FIG. 8C and FIG. 9B, when the gas containing $SF_6$ is used and the ICP-RIE with bias power of 10 watts to 60 watts is used, a processing time for the etching shown in FIG. 8C may be set to be longer than a processing time for the etching shown in FIG. 9B.

Besides this, the design that the concentration of fluorine in the first region 80 is higher than the concentration of fluorine in the second region 82 also may be achieved by suitably changing the concentration or type of the gas containing fluorine, or other conditions.

Figure 10:
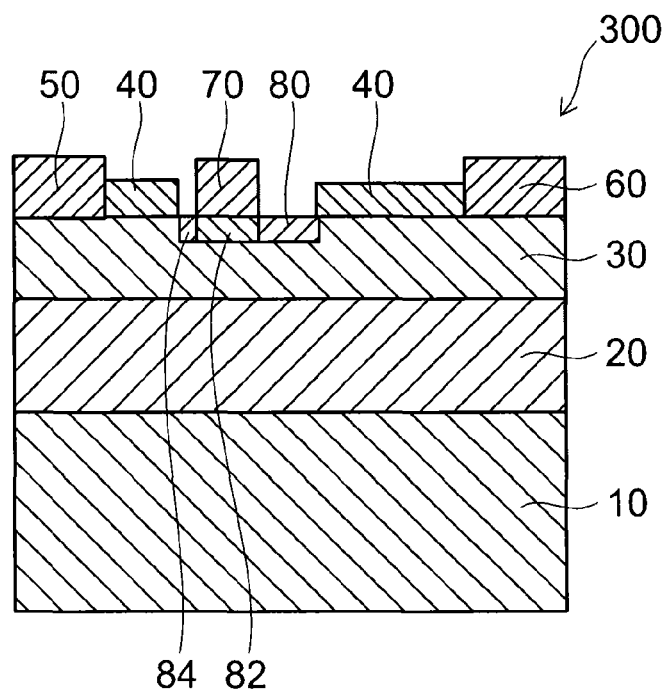
FIG. 10 is a schematic cross-sectional view of a nitride semiconductor device according to a third embodiment.

FIG. 10 is a schematic cross-sectional view of a nitride semiconductor device according to a third embodiment.

In a semiconductor device 300 according to the embodiment, a third region 84 containing fluorine is provided in a portion adjacent to the gate electrode 70 on the source electrode side. The concentration of fluorine in the third region 84 may be set to be equal to the concentration of fluorine in the first region 80.

Under an operation condition in which a large negative voltage is applied to a gate electrode, the strength of electric field also becomes large at the gate edge on the source electrode side and strong stress is generated there. Thus, it is advantageous to reduce the stress by providing the region 84.

Figure 11:
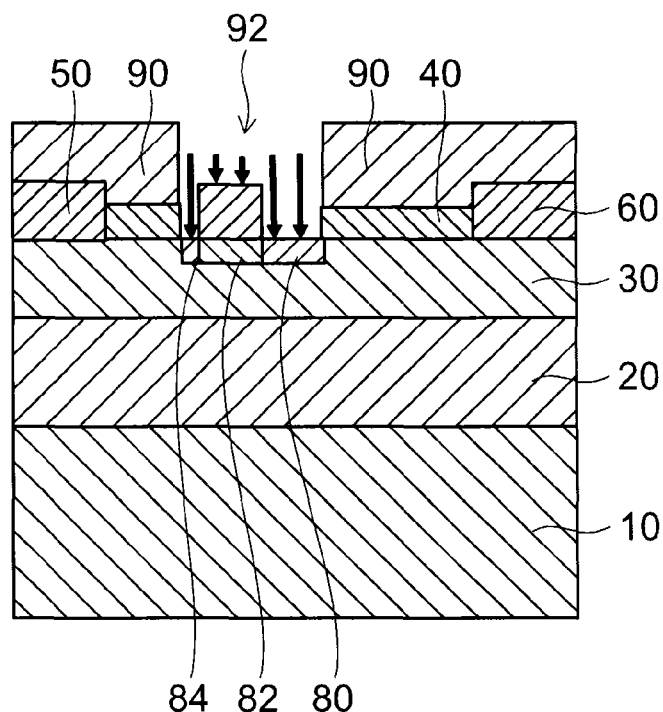
FIG. 11 is a schematic cross-sectional view illustrating part of a manufacturing method of the semiconductor device according to the third embodiment.

FIG. 11 is a schematic cross-sectional view illustrating part of a manufacturing method of a semiconductor device 300 according to the third embodiment. FIG. 11 corresponds to the process illustrated in FIG. 9B.

As described above referring to FIG. 9B, at the time of forming a first region 80, fluorine can be introduced into a second layer 30 in a self-aligned manner by using a gate electrode 70 as a mask.

In the embodiment, an opening 92 of a mask 90 is formed to be much wider so that a portion of the second layer 30 located near the gate edge on the source electrode side may be exposed. When fluorine is introduced through this opening 92, a third region 84 may also be formed in a self-aligned manner by using the gate electrode 70 as a mask. Thus, the concentration of fluorine in the first region 80 is almost equal to the concentration of fluorine in the third region 84.

For reducing on-resistance of a semiconductor device or enabling a semiconductor device to perform high-frequency operation, it is an effective way to reduce a gate length. However, it is difficult to form the opening 92 such that the edge of the opening 92 is located on the gate electrode 70 as illustrated in FIG. 9B, when the gate length is shortened.

On the other hand, since the opening 92 is formed such that the gate electrode 70 may be located within an area of the opening 92, high precision is not necessary in position control. Thus, the manufacturing process becomes easy in the embodiment.

Figure 12:
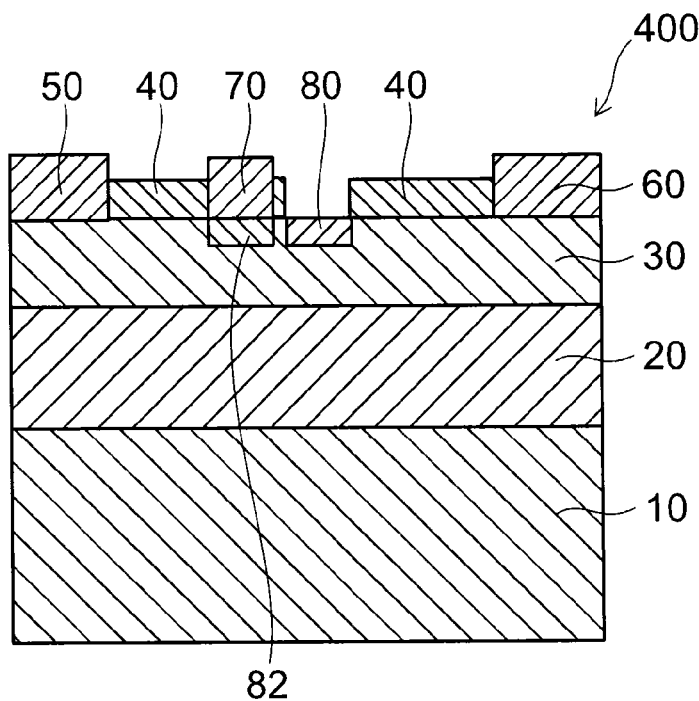
FIG. 12 is a schematic cross-sectional view of a nitride semiconductor device according to a fourth embodiment.

FIG. 12 is a schematic cross-sectional view of a nitride semiconductor device according to a fourth embodiment.

In a semiconductor device 400 according to the embodiment, a first region 80 is provided on the surface of a second layer 30 so as to be slightly separated from a gate electrode 70.

Figure 13:
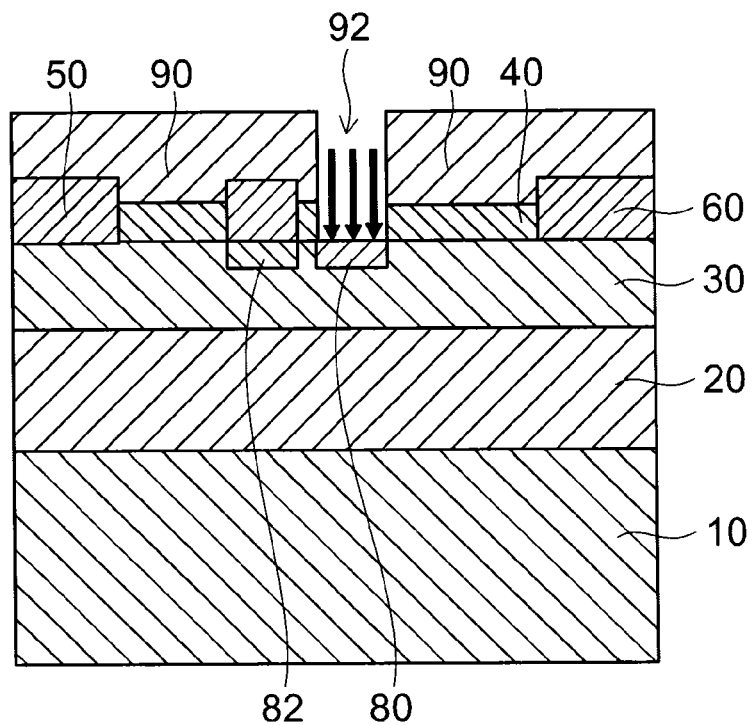
FIG. 13 is a schematic cross-sectional view illustrating part of a manufacturing method of the semiconductor device according to the fourth embodiment.

FIG. 13 is a schematic cross-sectional view illustrating part of a manufacturing method of the semiconductor device 400. FIG. 13 corresponds to the process illustrated in FIG. 9B.

When a gate length is shortened as mentioned above in connection with the third embodiment, it is difficult to form an opening 92 such that the edge of the opening 92 is located on a gate electrode 70 as illustrated in FIG. 9B. In the embodiment, since the opening 92 is formed to spread over the outside the gate electrode, even when the gate length is short, high precision in position control is not necessary. Therefore, the embodiment has an advantage of easy manufacturing.

Figure 14:
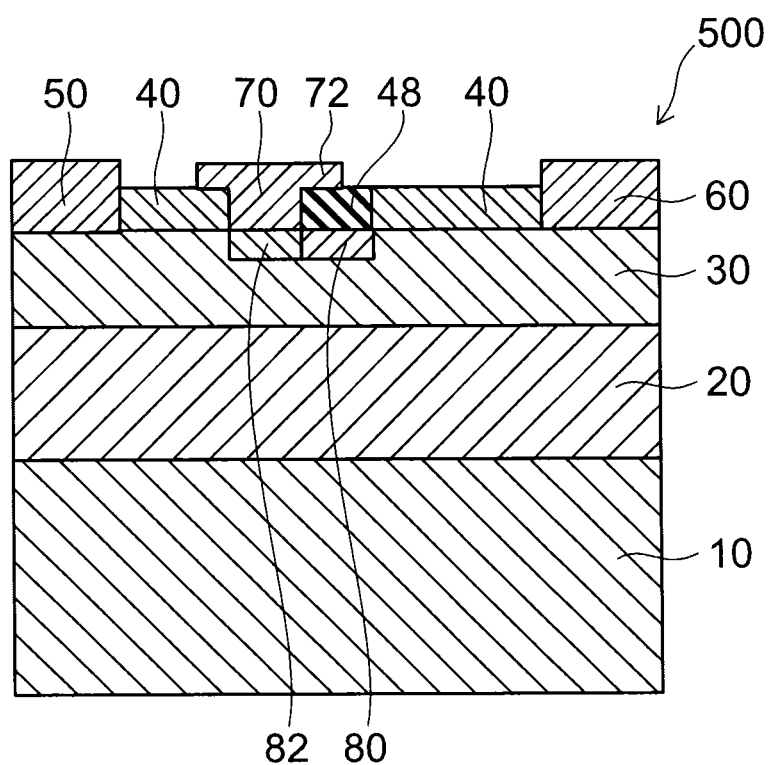
FIG. 14 is a schematic cross-sectional view of a nitride semiconductor device according to a fifth embodiment.

FIG. 14 is a schematic cross-sectional view of a nitride semiconductor device according to a fifth embodiment.

An insulation film 48 is provided on a first region 80 in a semiconductor device 500 according to the embodiment. A gate electrode 70 is formed on the insulation film 48 and has an extension 72 which extends in a direction toward a drain electrode 60. The extension 72 serves as a field plate. That is, the electric field exerting on a second layer 30 provided directly underneath the gate electrode 70 is alleviated with the provision of the extension 72, and especially the electric field at a portion near the drain is reduced.

As a result, it becomes possible to obtain synergistic effect of the alleviation of the electric field by the first region 80 and the alleviation of the electric field by the extension 72.

A method of manufacturing the semiconductor device 500 is as follows.

That is, after the processes described referring to FIGS. 8A to 9C are performed, an insulation film 48 is formed on the first region 80. Subsequently, a conductive material such as metal is deposited and then patterned so that the extension 72 connected to the gate electrode 70 can be formed.

Hereinabove, the embodiments have been described with reference to specific examples. However, embodiments are not limited to these specific examples. That is, ones achieved as a result of suitable design change or variation to the specific examples by those skilled in the art also may fall within the embodiments of the invention as long as the ones inherit the features of the embodiments. As for components included in respective specific examples, arrangement, material, condition, shape, size, and the like of each component may not be particularly limited to those in the examples, but be suitably changed.

Moreover, components in respective embodiments described above may be combined as long as such a combination is feasible in terms of technology, and such a combination also may fall within the embodiments as long as the combination inherit the features of the embodiments. Additionally, those skilled in the art will appreciate that various modifications and variations may be conceived, without departing from the scope and spirit of the embodiments, and such modifications and variations may fall within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first layer including a first nitride semiconductor;
a second layer provided on the first layer and including a second nitride semiconductor having a wider bandgap than a bandgap of the first nitride semiconductor;
a source electrode and a drain electrode provided on the second layer;
a gate electrode provided on the second layer and located between the source electrode and the drain electrode, the second layer including a first region between the gate electrode and the drain electrode, the first region being selectively provided in the second layer and containing fluorine distributed in a depth direction with a range of at least ranging from a surface of the second layer to a depth of 5 nanometers; and
a passivation layer provided on the second layer between the source electrode and the gate electrode, and on the second layer between the gate electrode and the drain electrode except on the first region,
wherein a concentration of fluorine contact resistance is highest at a surface of the first region and decreases in the depth direction, and
wherein the fluorine is not contained in a portion underneath the gate electrode in the second layer.

2. The device according to claim 1, wherein the first region is adjacent to the gate electrode.

3. The device according to claim 1, wherein a crystal growth face in the second layer is (0001) face.

4. The device according to claim 1, wherein a two-dimensional electron gas is provided at an interface between the first layer and the second layer.

5. The device according to claim 1, wherein the first layer is a GaN layer, and the second layer is an AlGaN layer.

* * * * *